United States Patent
Jeang et al.

(10) Patent No.: US 11,823,961 B2
(45) Date of Patent: Nov. 21, 2023

(54) SUBSTRATE INSPECTION SYSTEM AND METHOD OF MANUFACTURING SEMICONDUCTOR DEVICE USING SUBSTRATE INSPECTION SYSTEM

(71) Applicant: SAMSUNG ELECTRONICS CO., LTD., Suwon-si (KR)

(72) Inventors: Eunhee Jeang, Paju-si (KR); Boris Afinogenov, Suwon-si (KR); Sangwoo Bae, Seoul (KR); Wondon Joo, Seoul (KR); Maksim Riabko, Suwon-si (KR); Anton Medvedev, Suwon-si (KR); Aleksandr Shorokhov, Suwon-si (KR); Anton Sofronov, Suwon-si (KR); Ingi Kim, Seoul (KR); Taehyun Kim, Suwon-si (KR); Minhwan Seo, Hwaseong-si (KR); Sangmin Lee, Yongin-si (KR); Seulgi Lee, Cheongju-si (KR)

(73) Assignee: SAMSUNG ELECTRONICS CO., LTD.

(*) Notice: Subject to any disclaimer, the term of this patent is extended or adjusted under 35 U.S.C. 154(b) by 671 days.

(21) Appl. No.: 17/021,087

(22) Filed: Sep. 15, 2020

(65) Prior Publication Data
US 2021/0305106 A1    Sep. 30, 2021

(30) Foreign Application Priority Data
Mar. 26, 2020   (KR) .................. 10-2020-0036652

(51) Int. Cl.
*H01L 21/66*   (2006.01)
*H01L 21/67*   (2006.01)
(Continued)

(52) U.S. Cl.
CPC .......... *H01L 22/12* (2013.01); *G01N 21/648* (2013.01); *G01N 21/9505* (2013.01); *H01L 21/67288* (2013.01); *G01N 2201/06113* (2013.01)

(58) Field of Classification Search
None
See application file for complete search history.

(56) References Cited

U.S. PATENT DOCUMENTS 6,172,749 B1   1/2001   Watanabe
7,295,739 B2   11/2007  Solarz
(Continued)

FOREIGN PATENT DOCUMENTS

JP    2011-185706 A    9/2011

OTHER PUBLICATIONS

"Nondestructive evaluation of differently doped InP wafers by time-resolved four-wave mixing technique" by Kadys et al. (Year: 2006).*

(Continued)

*Primary Examiner* — Evren Seven
(74) *Attorney, Agent, or Firm* — Fish & Richardson P.C.

(57) ABSTRACT

A substrate inspection apparatus includes a light source unit, a pulsed beam matching unit, a substrate support unit, an incidence angle adjusting unit, and a detecting unit. The light source unit emits a first laser beam having a first wavelength and a second laser beam having a second wavelength. The pulsed beam matching unit matches the first laser beam and the second laser beam to superimpose a pulse of the first laser beam on a pulse of the second laser beam in time and space. The substrate support unit supports a substrate to be inspected. The incidence angle adjusting unit adjusts angles of incidence of the matched first laser beam and second laser beams to irradiate the first laser beam and the second laser
(Continued)

beam on the substrate, and mixes the first laser beam and the second laser beam to generate an evanescent wave on the substrate. The evanescent wave generates scattered light due to a defect of the substrate. The detecting unit detects the scattered light generated due to the defect of the substrate.

20 Claims, 9 Drawing Sheets

(51) Int. Cl.
*G01N 21/95* (2006.01)
*G01N 21/64* (2006.01)

(56) References Cited

U.S. PATENT DOCUMENTS

| | | |
|---|---|---|
| 7,627,007 B1 | 12/2009 | Armstrong et al. |
| 9,419,407 B2 | 8/2016 | Deng et al. |
| 10,067,067 B2 | 9/2018 | Lee et al. |
| 10,274,310 B2 | 4/2019 | Hunt et al. |
| 2005/0254049 A1 | 11/2005 | Zhao et al. |
| 2006/0083470 A1 | 4/2006 | Solarz |
| 2011/0194101 A1 | 8/2011 | Tachizaki et al. |
| 2015/0377795 A1 | 12/2015 | Zhao et al. |
| 2018/0217065 A1 | 8/2018 | Haller |
| 2020/0057104 A1* | 2/2020 | Ma .................. G01R 31/308 |

OTHER PUBLICATIONS

"Four-wave mixing microscopy of nanostructures" by Wang et al. (Year: 2010).*

Hayk Harutyunyan, et al. "Nonlinear Dark-Field Microscopy", 2010 American Chemical Society Nano Lett. 2010, 10, pp. 5076-5079.

Francesco Masia, et al. "Triply Surface-Plasmon resonant four-wave mixing imaging of gold nanoparticles", Proc. of SPIE vol. 7911, 79110Y • © 2011 SPIE.

* cited by examiner

SUBSTRATE INSPECTION SYSTEM AND METHOD OF MANUFACTURING SEMICONDUCTOR DEVICE USING SUBSTRATE INSPECTION SYSTEM

CROSS-REFERENCE TO RELATED APPLICATION(S)

This U.S. nonprovisional patent application claims benefit of priority under 35 U.S.C. § 119 to Korean Patent Application No. 10-2020-0036652, filed on Mar. 26, 2020 in the Korean Intellectual Property Office, the disclosure of which is incorporated herein by reference in its entirety.

BACKGROUND

1. Technical Field

The inventive concept(s) described herein relate to a substrate inspection system, and more particularly, to a substrate inspection system capable of detecting a defect on a substrate, and a method of manufacturing a semiconductor device using the substrate inspection system.

2. Description of the Related Art

A defect present on a surface of a semiconductor wafer or a semiconductor device may affect reliability and yield of the semiconductor device. Various non-destructive defect detection methods, using light, may be used for detecting defects.

Separately, the usefulness of a source light beam in detecting fine defects varies based on the wavelength of the source light beam. A relatively shorter wavelength of the source light beam makes the source light beam more advantageous in detecting fine defects. However, a relatively shorter wavelength for a source light beam may make it more difficult to distinguish signals for defects from noise due to surface roughness of the semiconductor wafer or the semiconductor device.

SUMMARY

According to an aspect of the present disclosure, a substrate inspection apparatus is provided with a capability of accurately detecting a fine defect on a substrate.

According to another aspect of the inventive concept(s) described herein, a substrate inspection apparatus includes a light source unit, a pulsed beam matching unit, a substrate support unit, an incidence angle adjusting unit, and a detecting unit. The light source unit is configured to emit a first laser beam having a first wavelength and a second laser beam having a second wavelength. The pulsed beam matching unit matches the first laser beam and the second laser beam to superimpose a pulse of the first laser beam on a pulse of the second laser beam in time and space. The substrate support unit supports a substrate to be inspected. The incidence angle adjusting unit adjusts angles of incidence of the matched first laser beam and second laser beam to irradiate the first laser beam and the second laser beam on the substrate, and mixes the first laser beam and the second laser beam to generate an evanescent wave on the substrate. The evanescent wave generates scattered light due to a defect of the substrate. The detecting unit detects the scattered light generated due to the defect of the substrate.

According to another aspect of the present disclosure, a method of manufacturing a semiconductor device includes providing a substrate to be inspected; outputting a first laser beam having a first wavelength and a second laser beam having a second wavelength; and matching the first laser beam and the second laser beam to superimpose a pulse of the first laser beam on a pulse of the second laser beam in time and space. The method of manufacturing the semiconductor device also includes adjusting angles of incidence of the matched first laser beam and second laser beam to irradiate the first laser beam and the second laser beam on the substrate and mixing the first laser beam and the second laser beam to generate an evanescent wave on the substrate. The evanescent wave generates scattered light due to a defect of the substrate. The method of manufacturing the semiconductor device further includes detecting the scattered light generated due to the defect of the substrate.

According to an aspect of the present disclosure, a method of manufacturing a semiconductor device includes providing a substrate to be inspected; and determining whether a defect of the substrate is present. The determining comprises: generating a first laser beam having a first wavelength; receiving the first laser beam to convert a portion of the first laser beam to a second laser beam having a second wavelength, different from the first wavelength, and outputting remaining portions of the first laser beam and the second laser beam via different paths. The determining also comprises superimposing a pulse of the first laser beam on a pulse of the second laser beam by reducing a delay time between the pulses; adjusting angles of incidence of the matched first laser beam and second laser beam to irradiate the first laser beam and the second laser beam on the substrate; and mixing the first laser beam and the second laser beam in a four-wave mixing (FWM) manner to generate an evanescent wave on the substrate. The evanescent wave generates scattered light due to the defect of the substrate. The determining further comprises detecting the scattered light generated due to the defect of the substrate.

According to an aspect of the present disclosure, a method of manufacturing a semiconductor device includes providing a substrate to be inspected; and determining whether a defect of the substrate is present. The determining comprises: generating a beam having a fundamental wavelength; wavelength-converting the beam having the fundamental wavelength into a wavelength-converted beam; and splitting the wavelength-converted beam into a split first beam, a split second beam, and a split third beam. The determining also comprises modulating a frequency of the split first beam to output a first laser beam having a first frequency; modulating a frequency of the split second beam to output a second laser beam having a second frequency; matching the first laser beam and the second laser beam to superimpose a pulse of the first laser beam on a pulse of the second laser beam in time and space; and adjusting angles of incidence of the matched first laser beam and second laser beam to irradiate the first laser beam and the second laser beam on the substrate; and mixing the first laser beam and the second laser beam in a four-wave mixing (FWM) manner to generate an evanescent wave on the substrate. The evanescent wave generates scattered light due to the defect of the substrate. The determining further comprises using the split third beam as a reference beam, to selectively detect only a signal based on the scattered light from light received from the substrate; and measuring intensity of the signal by the detected scattered light.

BRIEF DESCRIPTION OF DRAWINGS

The above and other aspects, features, and advantages of the inventive concept(s) described herein will be more clearly understood from the following detailed description, taken in conjunction with the accompanying drawings, in which.

DETAILED DESCRIPTION

Hereinafter, various embodiments of the present disclosure will be described in detail with reference to the accompanying drawings.

Figure 1:
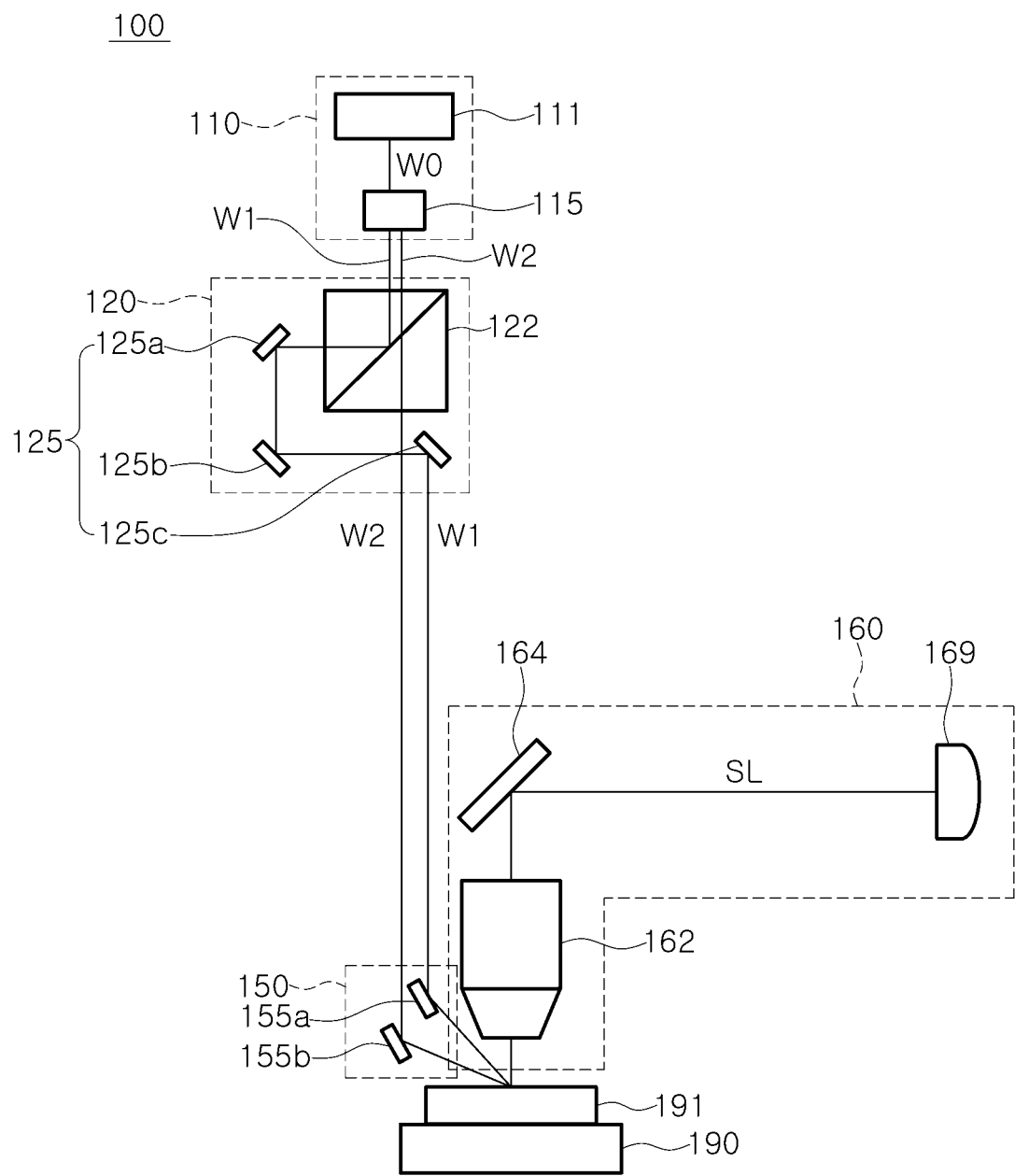
FIG. 1 is a view schematically illustrating a substrate inspection apparatus, according to an embodiment of the present disclosure.

FIG. 1 is a view schematically illustrating a substrate inspection apparatus, according to an embodiment of the present disclosure.

Referring to FIG. 1, a substrate inspection apparatus 100 according to this embodiment may include a substrate support unit 190 supporting the substrate 191 to be inspected, a light source unit 110, a pulsed beam matching unit 120, an incidence angle adjusting unit 150, and a detecting unit 160. The light source unit 110 may generate and may emits a first laser beam W1 and a second laser beam W2 and may be referred to alternatively as a light source, a laser light source, a light source circuit or a laser light source circuit. The pulsed beam matching unit 120 matches a pulse of the first laser beam W1 and a pulse of the second laser beam W2 in time and space. For example, the pulsed beam matching unit 120 may ensure that the pulse of the first laser beam W1 and the pulse of the second laser beam W2 are superimposed so as to exist at the same time and in the same space. The incidence angle adjusting unit 150 adjusts an angle at which the first laser beam W1 and the second laser beam W2 are irradiated into a substrate 191. The detecting unit 160 detects a defect of the substrate 191.

A substrate inspection apparatus 100 according to this embodiment may couple the first and second laser beams W1 and W2 in a four-wave mixing (FWM) manner, and may use an evanescent wave generated from the substrate 191, to detect the defect of the substrate 191. For example, the defect may include a foreign material such as a particle, various defects such as an abnormal growth of a pattern, or the like. Four-wave mixing (FWM) is a term generally used for describing an optical effect resulting from the interaction between waves (e.g., light beams) or photons with different wavelengths that are overlapping in time to produce a wave with another wavelength. The optical effect of Four-Wave-Mixing (FWM) is nonlinear and the interaction between waves or photons is due to third order nonlinearity of the medium (e.g., material) through which the waves or photons travel. Additionally, an evanescent wave is a field (electric or magnetic) with energy spatially concentrated near the surface of the substrate 191, may be referred to as a "surface wave" which substantially lacks a component propagating away from a surface. When a defect is not present on the substrate 191, the evanescent wave may be exponentially attenuated and will thus disappear. When a defect is present on the substrate 191, the evanescent wave may collide with the defect to generate scattered light SL. Information (including presence or absence, size, and location) relating to the defect may be detected based on the scattered light SL. In this method, since a background signal is zero (0), only a signal related to the scattered light SL due to the defect may be detected, and as a result, a signal-to-noise ratio (SNR) may be improved.

In this embodiment, the evanescent wave may be generated by coupling the first and second laser beams W1 and W2 emitted from the light source unit 110 in the FWM manner. The coupling by the FWM manner may be implemented by a pulsed beam matching unit 120 and the incidence angle adjusting unit 150.

Hereinafter, a main configuration of a substrate inspection apparatus 100 according to this embodiment will mainly be described.

First, the light source unit 110 may be configured to emit the first and second laser beams W1 and W2, oscillated as pulses. In this embodiment, the first and second laser beams W1 and W2 may be laser beams respectively having first and second wavelengths, different from each other. The light source unit 110 employed in this embodiment may include a laser light source 111 configured to perform functions including generating and emitting a fundamental wave beam W0, substantially the same as the first laser beam W1, and an optical parametric amplifier 115 (OPA) configured to provide laser beams of different wavelengths, from the fundamental wave beam W0. The optical parametric amplifier 115 may convert a portion of the fundamental wave beam W0 into the second laser beam W2 and leave another portion of the fundamental wave beam W0. As a result, the light source unit 110 will output the first laser beam W1 and the second laser beam W2. For example, the optical parametric amplifier 115 may include a non-linear crystal.

The first and second wavelengths may be set such that the first and second laser beams W1 and W2 are coupled in an FWM manner to generate a wave (e.g., an evanescent wave) of a relatively short wavelength (e.g., deep ultraviolet (DUV)). In some embodiments, since the first wavelength may be in the range of 200 nm to 2000 nm, and the second wavelength may be in the range of 200 nm to 2000 nm, a wavelength of an evanescent wave, among beams generated on the substrate 191, may be 200 nm to 2000 nm, and preferably 800 nm or less. For example, the first wavelength may be about 800 nm, the second wavelength may be about 400 nm, and a wavelength of an evanescent wave may be about 266 nm.

As described above, since laser beams of different wavelengths may be coupled in an FWM manner to generate a wave (e.g., an evanescent wave) of a relatively short wavelength (e.g., deep ultraviolet (DUV)), detection of a defect of a fine size (e.g., about 10 nm or less) may be significantly improved.

The first and second laser beams W1 and W2, emitted from the light source unit 110, may be coupled in an FWM manner by the pulsed beam matching unit 120 and the incidence angle adjusting unit 150. The coupling of the first and second laser beams W1 and W2 results in generation of an evanescent wave on the substrate 191 (in particular, on a surface of the substrate 191).

The pulsed beam matching unit 120 may be configured to superimpose a pulse of the first laser beam W1 and a pulse of the second laser beam W2 in time and space. In this specification, this expression of "superimpose . . . in time and space" may mean that a pulse of the first laser beam W1 and a pulse of the second laser beam W2 "match." The pulsed beam matching unit 120 may be configured to reduce a time delay between the pulse of the first laser beam W1 and the pulse of the second laser beam W2. For example, the pulsed beam matching unit 120 may be configured to adjust a path of one beam (e.g., the first laser beam W1).

The pulsed beam matching unit 120 employed in this embodiment may include a beam splitter 122 and an optical delay line 125 that may select the one beam and may delay a pulse of the one beam, as illustrated in FIG. 1. The beam splitter 122 may receive the first laser beam W1 and the second laser beam W2 from the light source unit 110, and may split and output the first laser beam W1 and the second laser beam W2 in different paths. The first laser beam W1, split from the beam splitter 122, may be selectively input to the optical delay line 125. The optical delay line 125 may include a plurality of mirrors 125$a$, 125$b$, and 125$c$ arranged on the path of the first laser beam W1 to reduce a time delay between the pulse of the first laser beam W1 and the pulse of the second laser beam W2.

The substrate support unit 190 may be a three-dimensional structure formed of a material suitable to provide stable support for the substrate 191, and may be alternative referred to as a support, a support structure, a structural support or other similar terminology. The substrate support unit 190 may have dimensions in a width direction and a depth direction wider than the substrate 191, although the substrate support unit 190 is not limited to such dimensions. Additionally, as described herein, the substrate support unit 190 may be movable, such as by being dynamically controlled to move in directions in amounts determined by a logical controller such as a processor.

As described herein, a pulsed beam matching unit 120, an incidence angle adjusting unit 150, and a detecting unit 160 may include components used to perform the functionality attributed to these elements of the substrate inspection apparatus 100. The detecting unit 160 may alternatively be referred to as a detector or other similar terminology. Additionally, a separate controller or control unit may be provided to logically control elements and components of the substrate inspection apparatus 100 or other substrate inspection apparatuses described herein. For example, a separate controller or control unit may include a processor that executes instructions to logically reach results that can be sent as electronic signals to control the elements and components of the substrate inspection apparatus 100 or other substrate inspection apparatuses described herein.

Figure 2:
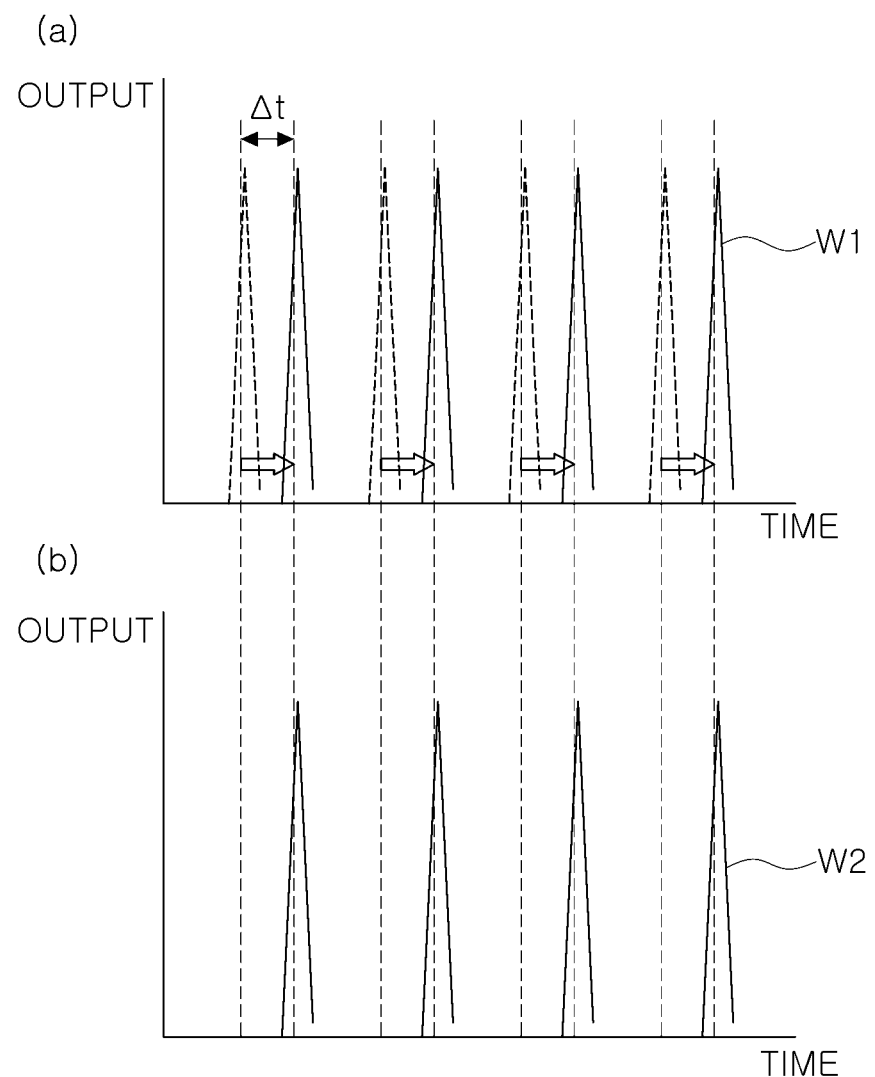
FIG. 2A and FIG. 2B are graphs illustrating a pulse of a first laser beam and a pulse of a second laser beam, respectively.

FIG. 2A and FIG. 2B are graphs illustrating a pulse of a first laser beam and a pulse of a second laser beam, respectively.

Referring to FIG. 2A, a dotted line represents a pulse of a first laser beam W1 before input to the optical delay line 125, and a solid line represents a pulse of the first laser beam W1 delayed (or matched) by the optical delay line 125. The optical delay line 125 may delay the pulse of the first laser beam W1 by a time period ($\Delta t$) required for matching a pulse of a second laser beam W2 and a pulse of the first laser beam W1. For example, the delayed time period ($\Delta t$) required for such matching may be 1 ns or several ns, or sub ns (i.e., ps units). As illustrated in FIG. 2A and FIG. 2B, a pulse of the first laser beam W1 and a pulse of the second laser beam W2 may be superimposed in time and space. For example, a pulse of the first laser beam W1 and a pulse of the second laser beam W2 may be matched in time and space.

The matched first and second laser beams W1 and W2 may be incident on the substrate 191 at incidence angles (at $\theta 1$ and $\theta 2$ in FIG. 5A and FIG. 5B, respectively), adjusted for FWM coupling by the incidence angle adjusting unit 150. The incidence angle adjusting unit 150 employed in this embodiment may include mirrors 155$a$ and 155$b$ for adjusting the angles of incidence of the matched first and second laser beams W1 and W2. Each of the mirrors 155$a$ and 155$b$ may be arranged to be rotated by a separate driving unit, such that the first and second laser beams W1 and W2 are incident at a desired incidence angle on an inspection position of the substrate 191. The first laser beam W1 and the second laser beam W2, incident on the substrate 191, may be mixed to generate an evanescent wave. The evanescent wave may be referred to as a "surface wave" propagating along a surface of the substrate 191 at a predetermined incidence angle.

Figure 3:
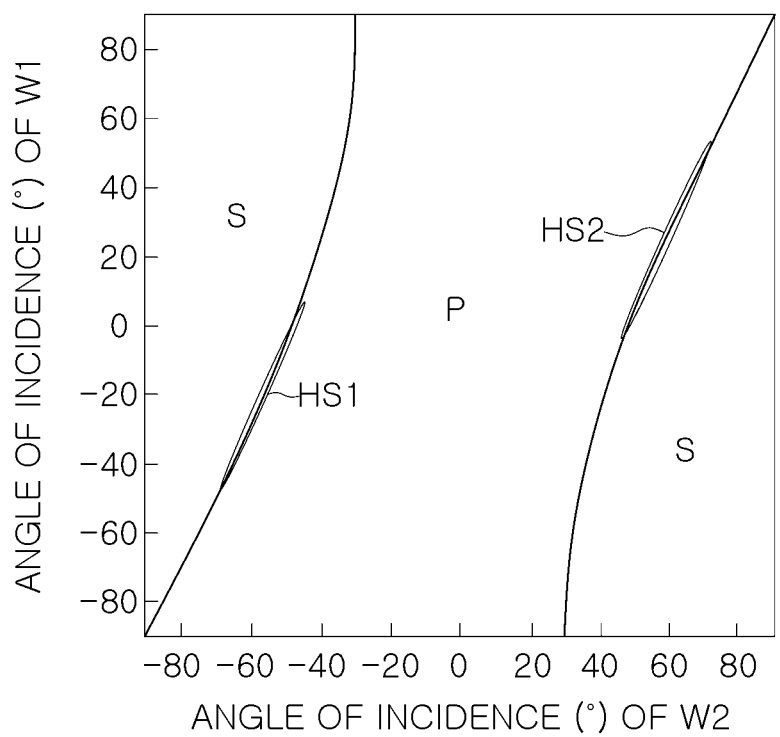
FIG. 3 is a graph illustrating a principle of generating an evanescent wave according to adjustment of an incidence angle of a first laser beam and an incidence angle of a second laser beam.

Incidence angle conditions of the first and second laser beams W1 and W2 for generating an evanescent wave will be described with reference to FIG. 3. FIG. 3 is a graph illustrating a principle of generating an evanescent wave according to adjustment of an incidence angle of a first laser beam W1 and an incidence angle of a second laser beam W2.

Referring to FIG. 3, a surface wave may be generally generated in a range in which an incidence angle of a second laser beam W2 is greater than or equal to ±30°. A surface wave, i.e., an evanescent wave S, may be generated to have high FWM efficiency in adjacent regions of boundary lines with a plane wave P respectively indicated by "HS1" and "HS2." For example, a region HS1 in which an incidence angle of a first laser beam W1 ranges from −30° to +10° when an incidence angle of a second laser beam W2 ranges from −60° to −40°, or a region HS2 in which an incidence angle of a first laser beam W1 ranges from −10° to +30° when an incidence angle of a second laser beam W2 ranges from +40° to +60°, may indicate incidence angle conditions in which an evanescent wave with high efficiency may be generated. The incidence angle adjusting unit 150 may satisfy the incidence angle conditions and irradiate the first and second laser beams W1 and W2 into the substrate 191, to generate an evanescent wave.

In an embodiment, an incidence angle of one laser beam of the first and second laser beams W1 and W2 may be set to irradiate in a direction, perpendicular to the surface of the substrate 191 (an incidence angle=0°). In this embodiment, only an incidence angle of the other laser beam thereof may be adjusted in an appropriate range, to generate an evanescent wave.

Figure 4:
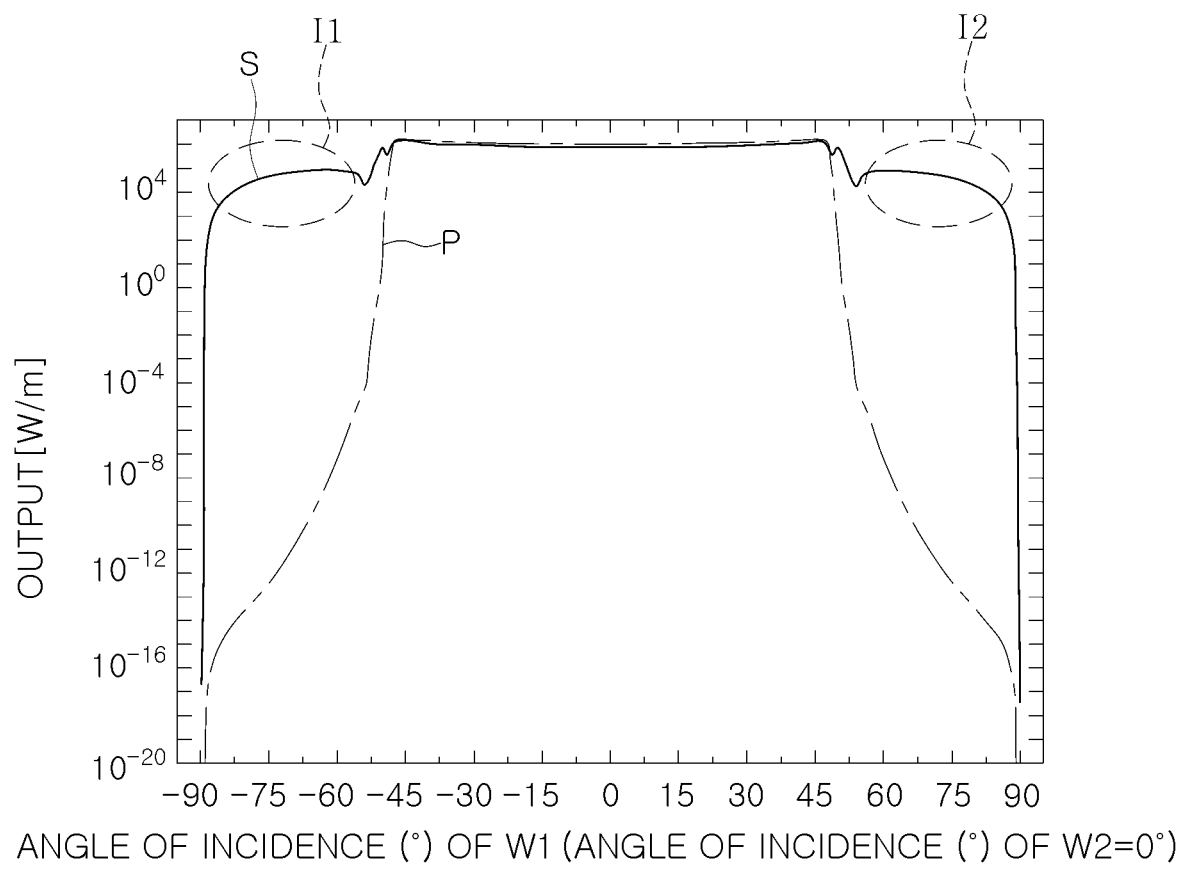
FIG. 4 is a graph illustrating a condition for generating an evanescent wave according to a change in incidence angle of a first laser beam where an incidence angle of a second laser beam=0°).

Referring to FIG. 4, when an incidence angle of the second laser beam W2 is 0°, an incidence angle of the first laser beam W1 may generate an evanescent wave S with almost no plane wave P in certain regions I1 and I2. In particular, the evanescent wave S may be generated with a high efficiency at an incidence angle of ±60° of the first laser beam W1. In some embodiments (e.g., see FIG. 6), since a numerical aperture of an objective lens (162A in FIG. 6) for adjusting an incidence angle may be 0.95 or more (e.g., 1.0), resolution of the objective lens may be greatly improved.

As described above, an optical system of the substrate inspection apparatus 100 may be configured such that the second laser beam W2 is fixed to be irradiated in a direction, perpendicular to the surface of the substrate (an incidence angle of 0°), while only an incidence angle of the first laser beam W1 is set (or adjusted) to have a range satisfying high-efficiency conditions. Accordingly, an incidence angle of one of the first laser beam W1 and the second laser beam W2 is fixed in advance, while the incidence angle of the other is dynamically adjusted to be in the range satisfying high-efficiency conditions.

The substrate support unit 190 may support the substrate 191 disposed on an upper surface of the substrate support unit 190. The substrate 191 may be a wafer for manufacturing a semiconductor device, or a manufactured wafer for a semiconductor device. Alternatively, the substrate 191 may be a transparent substrate such as a glass substrate. The substrate support unit 190 may be configured to move in a first direction and a second direction perpendicular to the first direction, e.g., in a horizontal plane direction, by a separate controller or control unit. In some embodiments, the substrate support unit 190 may additionally be configured to move in a third direction, perpendicular to a plane defined by the first direction and the second direction. In the course of the inspection, the substrate support unit 190 may be moved such that the substrate 191 is scanned. In addition, in the process of moving the substrate support unit 190, the incidence angle adjusting unit 150 may form focuses of the first and second laser beams W1 and W2 at an inspection position of the moved substrate 191.

Figure 5A:
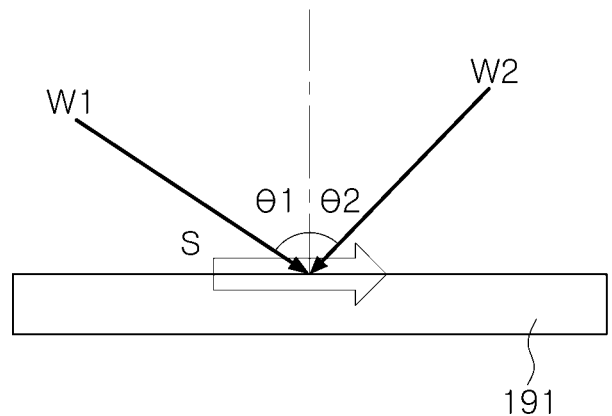
FIG. 5A and FIG. 5B are views schematically illustrating a principle of detecting a defect on a substrate using an evanescent wave.
Figure 5B:
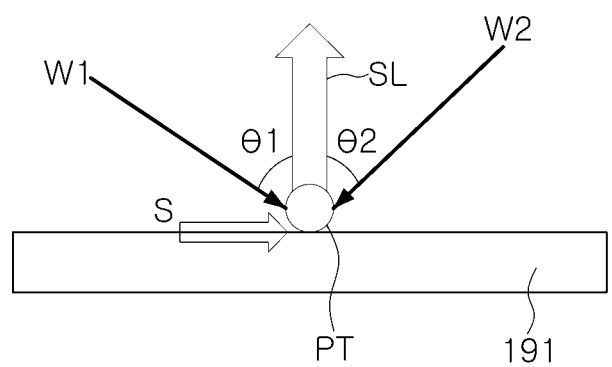

FIG. 5A and FIG. 5B are views schematically illustrating a principle of detecting a defect on a substrate using an evanescent wave.

Referring to FIG. 5A and FIG. 5B, first and second laser beams W1 and W2 matched to be incident to a substrate 191 to be inspected may be irradiated under the above-described incidence angle conditions, to generate an evanescent wave (or a surface wave) S. As illustrated in FIG. 5A, when a defect PT such as a particle is not present, an evanescent wave S may be exponentially attenuated, and will thus disappear. As illustrated in FIG. 5B, when a defect PT is present on the substrate 191, the evanescent wave S may collide with the defect PT to generate scattered light SL.

The detecting unit 160 may detect the defect PT, based on the scattered light SL illustrated in FIG. 5B. The detecting unit 160 employed in this embodiment may include an objective lens 162 disposed on the substrate 191 and gathering scattered light SL, a light selector 164 for selectively transmitting the scattered light SL generated by the evanescent wave S from light reflected from the substrate 191, and a scattered light detector 169 for measuring intensity of the scattered light SL transmitted from the light selector 164. For example, the objective lens 162 may include at least one convex or concave lens.

In this embodiment, other types of beams may be generated by the first and second laser beams W1 and W2 being irradiated on the substrate 191 due to optical effects other than evanescence. Such other beams may include a signal generated based on, for example, sum frequency generation (SFG), second harmonic generation (SHG), third harmonic generation (THG), or the like, and are in addition to the evanescent wave (or the scattered light) generated in the FWM manner due to the first and second laser beams W1 and W2 and non-linear characteristics of a material. The detecting unit may selectively detect only scattered light by using the light selector 164. For example, the light selector 164 may include a wavelength selection filter or a dichroic mirror. The selected scattered light SL may be received by the scattered light detector 169, to measure whether a defect is generated or not and characteristics (e.g., size) of the defect based on intensity. For example, the scattered light detector 169 may include a photo multiplier tube (PMT) or an electron multiplying CCD (EMCCD).

As described above, the substrate inspection apparatus 100 according to this embodiment may couple the first and second laser beams W1 and W2 in a four-wave mixing (FWM) manner, and use an evanescent wave produced by the substrate 191, to detect a defect of the substrate 191. In this case, since a background signal is zero (0), only a signal related to the scattered light SL due to the defect may be detected, and as a result, a signal-to-noise ratio (SNR) may be greatly improved. In addition, the first and second laser beams W1 and W2 having different first and second wavelengths may be coupled to generate an evanescent wave having a relatively short wavelength (e.g., 800 nm or less), and accurately detect a defect of a fine size (e.g., about 10 nm or less).

Figure 6:
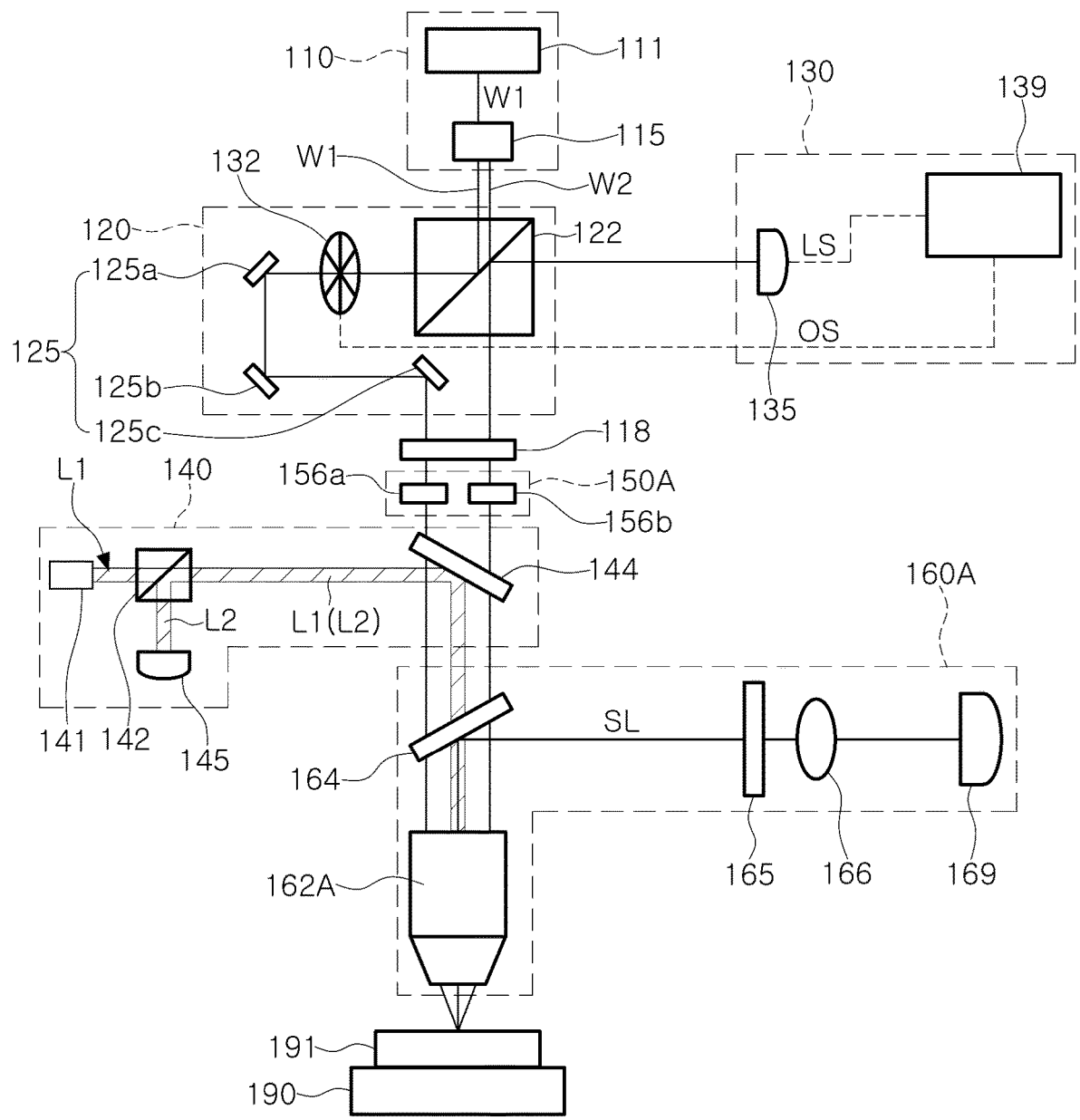
FIG. 6 is a view schematically illustrating a substrate inspection apparatus, according to an embodiment of the present disclosure.

FIG. 6 is a view schematically illustrating a substrate inspection apparatus, according to an embodiment of the present disclosure.

Referring to FIG. 6, a substrate inspection apparatus 100A according to this embodiment can be understood to be similar to the substrate inspection apparatus 100 illustrated in FIG. 1, except that an incidence angle adjusting unit 150A and a detecting unit 160A are configured differently from corresponding components of the previous embodiments, and a matching monitoring unit 130, a sample monitoring unit 140, and a polarizer 118 are further included. In addition, components of this embodiment can be understood by referring to the descriptions of the same or similar components of the substrate inspection apparatus 100 illustrated in FIG. 1, unless specifically stated otherwise.

The substrate inspection apparatus 100A according to this embodiment may be configured to couple first and second laser beams W1 and W2 in an FWM manner. In this embodiment, the substrate inspection apparatus 100A may use an evanescent wave generated from a substrate 191, similar to the previous embodiment, to detect a defect of the substrate 191.

Specifically, as illustrated in FIG. 6, the substrate inspection apparatus 100A may include a light source unit 110, an incidence angle adjusting unit 150A, a detecting unit 160A, a substrate support unit 190, a matching monitoring unit 130 and a sample monitoring unit 140. The matching monitoring unit 130 may monitor matching between a pulse of the first laser beam W1 and a pulse of the second laser beam W2. The sample monitoring unit 140 may monitor an inspection region of the substrate 191.

The incidence angle adjusting unit 150A employed in this embodiment may include an objective lens 162A disposed on the substrate support unit 190 and a first beam path adjuster 156a and a second beam path adjuster 156b. The objective lens 16sA is configured to change a light-emitting angle of the objective lens, depending on a light-receiving position on a light-receiving surface of the objective lens. The first beam path adjuster 156a and second beam path adjuster 156b are configured to respectively change a path of the first laser beam W1 and a path of the second laser beam W2, to adjust the light-receiving position on the light-receiving surface of the objective lens.

The first beam path adjuster 156a and second beam path adjusters 156b may be configured to move in first and second directions, intersecting with each other in a horizontal plane, and may include an optical mechanism (e.g., a reflection mirror or a refractive index layer) capable of changing paths of the first and second laser beams W1 and W2, depending on a moved position. The first beam path adjuster 156a and second beam path adjuster 156b may be configured to move by a control signal received from a separate control unit or controller. In this embodiment, although a configuration that includes both the first beam path adjuster 156a and second beam path adjuster 156b and that can change both of the paths of the first laser beam W1 and the second laser beam W2 is illustrated, only one beam path adjuster may be included to change only a path of at least one of the first laser beam W1 and the second laser beam W2. In some embodiments, such as the embodiments described with respect to FIG. 4, the second laser beam W2 may be configured to be irradiated perpendicularly to the surface of the substrate 191, and only the first beam path adjuster 156a may be included to set or adjust an incidence angle of the first laser beam W1 to have a certain range.

Further, together with the first beam path adjuster 156a and second beam path adjuster 156b, the objective lens 162A may constitute an incidence angle adjusting unit 150 for adjusting an incidence angle. The objective lens 162A may include a convex lens, a concave lens, or a combination thereof, configured to change a light-emitting angle of the objective lens, depending on a light-receiving position on a light-receiving surface of the objective lens. The objective lens 162A employed in this embodiment may perform a function to collect the scattered light SL obtained from the substrate 191, similar to the objective lens 162 described in the previous embodiment, together with the above-described incidence angle adjustment function, simultaneously.

The matching monitoring unit 130 may be configured to monitor matching of a pulse of the first laser beam W1 and a pulse of the second laser beam W2. The monitoring of the matching may be based on intensity of mixed light of the first laser beam W1 and the second laser beam W2 on the substrate 191.

The matching monitoring unit 130 employed in this embodiment may include a frequency modulator 132, a photodiode 135, and a lock-in amplifier 139. The frequency modulator 132 may be disposed on a path of one laser beam of the first laser beam W1 and the second laser beam W2. The photodiode 135 receives mixed light reflected from the substrate 191 and measures intensity of the mixed light. The lock-in amplifier 139 is respectively connected to the frequency modulator 132 and the photodiode 135.

The frequency modulator 132 may be configured to modulate a frequency of the one laser beam of the first laser beam W1 and the second laser beam W2. In this embodiment, the frequency modulator 132 is illustrated as only being located in a path of the first laser beam W1. In another embodiment, a frequency modulator located on a path of the second laser beam W2 and modulating a frequency of the second laser beam W2 may be included as an alternative, or may be additionally included. For example, the frequency modulator 132 may include an optical chopper configured to periodically interfere with the one laser beam.

The lock-in amplifier 139 may amplify a signal LS received from the photodiode 135 without a noise component, in reference to a signal OS of an operating frequency of the frequency modulator 132, i.e., in reference to the modulated frequency. For example, when the first laser beam W1 and the second laser beam W2 match, a reflectance rate of the mixed light on the substrate 191 may decrease. Therefore, since the signal LS at this moment may be amplified and monitored by the lock-in amplifier 139, and a determination may be made whether desired matching of pulses has been achieved. In some embodiments, the lock-in amplifier 139 may be replaced with a non-linear crystal.

As set forth above, the frequency modulator 132 may be configured to modulate a frequency of one of the first laser beam W1 and the second laser beam W2. Mixed light from the substrate may be received to produce an optical signal LS that reflects intensity of the mixed light or that is otherwise related to intensity of the mixed light. The produced optical signal LS is amplified. The lock-in amplifier 139 may amplify the signal LS in reference to the signal OS of an operating frequency of the frequency modulator 132, i.e., in reference to the modulated frequency.

The sample monitoring unit 140 may be configured to monitor an inspection region of the substrate 191 using illumination light L1. The sample monitoring unit 140 employed in this embodiment may include an illumination light emitting unit 141 emitting the illumination light L1 to illuminate the inspection region of the substrate, and a CMOS unit 145 receiving illumination light L2 reflected from the inspection region of the substrate 191. The sample monitoring unit 140 may include a beam splitter 144 configured to transmit other beams related to the defect detection while reflecting the illumination light L1 and L2, and an optical filter 142 configured to selectively transmit/reflect the illumination light L1 and L2 in a traveling direction of the illumination lights L1 and L2. For example, the illumination light emitting unit 141 may include an LED having a predetermined wavelength.

The detecting unit 160A may include an objective lens 162A, a light selector 164, and a scattered light detector 169, similar to the previous embodiment, and may further include a compensator 165 and a lens 166, arranged between the light selector 164 and the scattered light detector 169. In addition, a substrate inspection apparatus 100A according to this embodiment may include a first polarizer 118a and a second polarizer 118b for adjusting polarization of a laser beam on a path of at least one of the first and second laser beams W1 and W2. The first polarizer 118a and the second polarizer 118b may be configured to linearly or circularly polarize the first and second laser beams W1 and W2 in a single direction. In some embodiments, the polarizer may adjust polarization of the first and second laser beams W1 and W2 to be different from one another.

At least one of the first polarizer 118a and the second polarizer 118b and the compensator 165 may rotate about an optical axis, and, in a similar manner to the first beam path adjuster 156a and second beam path adjuster 156b, may be arranged on a rotating stage equipped with a motor capable of being controlled by an electrical signal. In some embodiments, at least one of the first polarizer 118a and the second polarizer 118b and the compensator 165 may be replaced with a piezoelectric phase modulator.

Figure 7:
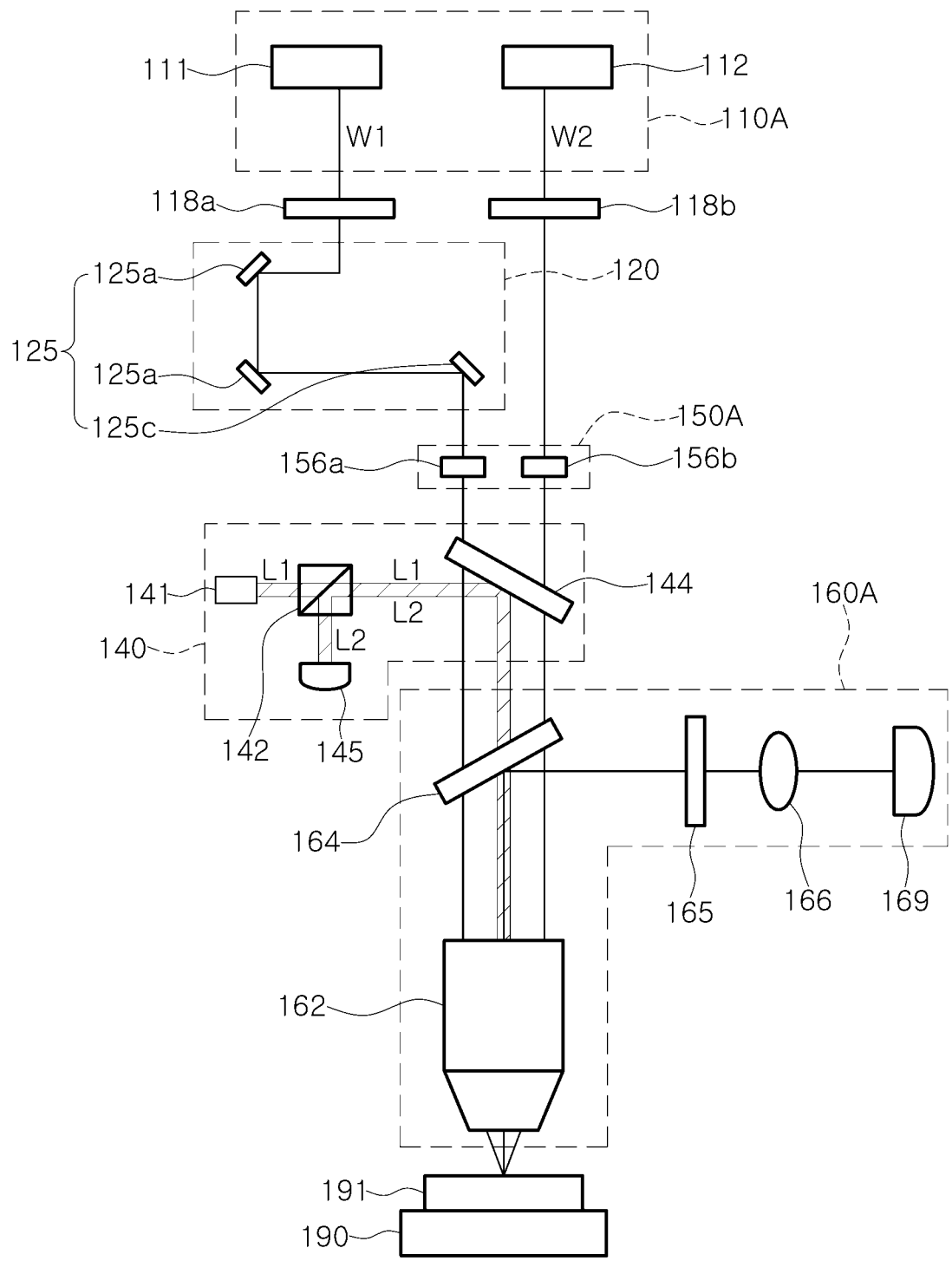
FIG. 7 is a view schematically illustrating a substrate inspection apparatus, according to an embodiment of the present disclosure.

FIG. 7 is a view schematically illustrating a substrate inspection apparatus, according to an embodiment of the present disclosure.

Referring to FIG. 7, a substrate inspection apparatus 100B according to this embodiment can be understood to be similar to the substrate inspection apparatus 100 illustrated in FIG. 6, except that a light source unit 110A includes two (2) laser light sources including the laser light source 111 and the laser light source 112 and does not include a separate matching monitoring unit. In addition, the components of this embodiment can be understood by referring to the description of the same or similar components of the substrate inspection apparatus 100 illustrated in FIG. 1 and the substrate inspection apparatus 100A illustrated in FIG. 6, unless specifically stated otherwise.

The substrate inspection apparatus 100B according to this embodiment, similar to the substrate inspection apparatus 100A illustrated in FIG. 6, may include a light source unit 110A, a pulsed beam matching unit 120A, a sample monitoring unit 140, an incidence angle adjusting unit 150A, a substrate support unit 190, and a detecting unit 160A. An evanescent wave, which is generated on the substrate 191 by coupling first and second laser beams W1 and W2 emitted from the light source unit 110A in an FWM manner, may be used to detect a defect on a substrate 191.

The light source unit 110A employed in this embodiment may include two (2) laser light sources including the laser light source 111 and the laser light source 112, different from each other, for emitting the laser beams W1 and W2, different from each other. As illustrated in FIG. 7, the light source unit 110A may include the laser light source 111 as a first laser light source emitting the first laser beam W1 and the laser light source 112 as a second laser light source emitting the second laser beam W2. The first and second laser beams W1 and W2 may be configured to emit light having a first wavelength and light having a second wavelength, respectively. The first and second wavelengths may be set to produce a wave (e.g., an evanescent wave) of a relatively short wavelength when the first and second laser beams W1 and W2 are coupled in an FWM manner. In some embodiments, since the first wavelength may be in the range of 700 nm to 800 nm, and the second wavelength may be in the range of 300 nm to 400 nm, a wavelength of an evanescent wave, among beams generated on the substrate 191, may be 800 nm or less.

The substrate inspection apparatus 100B according to this embodiment is illustrated to have a form that does not include a separate matching monitoring unit, but is otherwise similar to the embodiment illustrated in FIG. 6. However, in another embodiment based on this embodiment, a matching monitoring unit 130 may be further included to monitor matching of pulses of the first and second laser beams W1 and W2.

Figure 8:
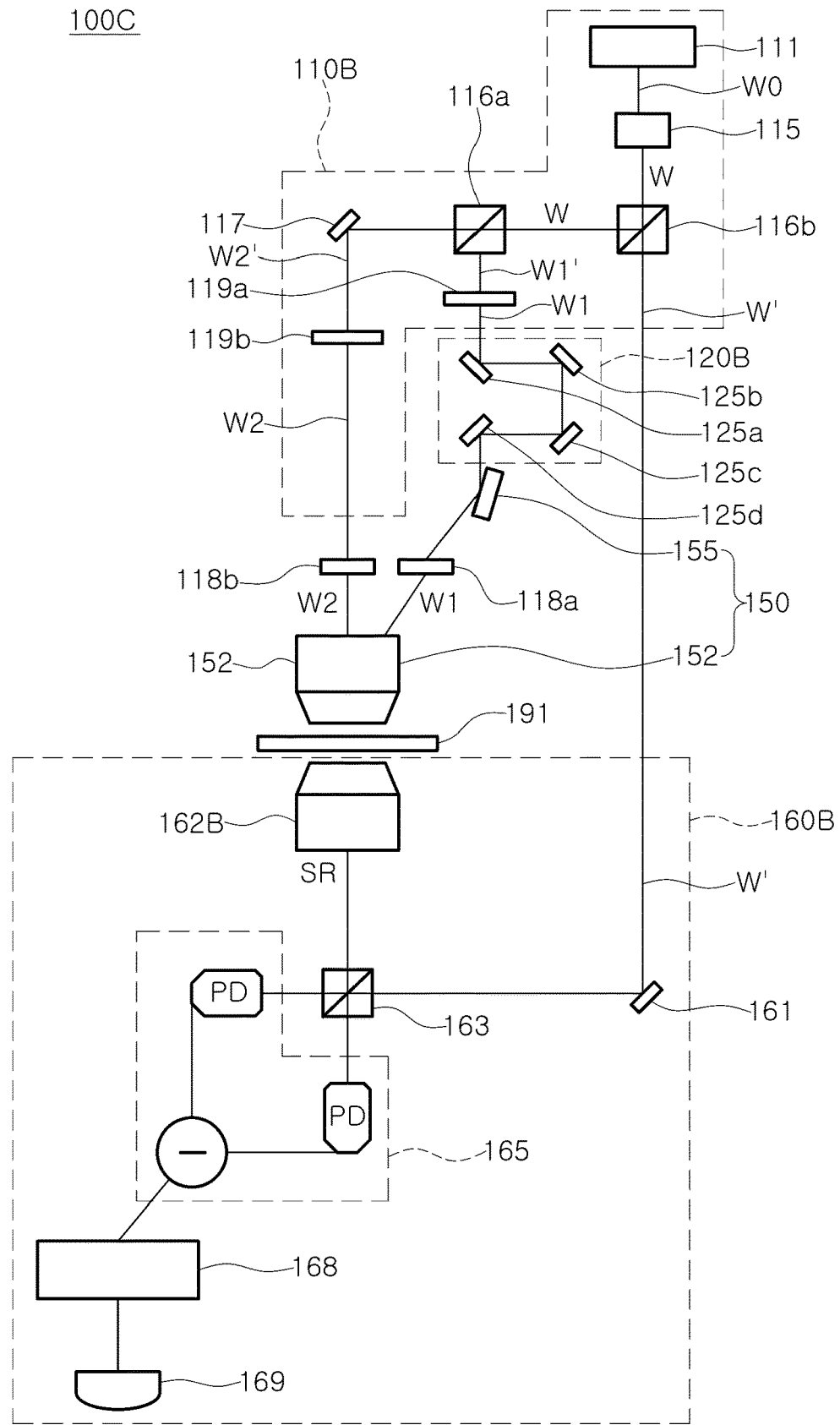
FIG. 8 is a view schematically illustrating a substrate inspection apparatus, according to an embodiment of the present disclosure.

FIG. 8 is a view schematically illustrating a substrate inspection apparatus, according to an embodiment of the present disclosure.

Referring to FIG. 8, a substrate inspection apparatus 100C according to this embodiment may include a light source unit 110B, a pulsed beam matching unit 120B, an incidence angle adjusting unit 150, a substrate support unit 190, and a detecting unit 160B. The light source unit 110B may perform functions including emitting a first laser beam W1 and a second laser beam W2. The pulsed beam matching unit 120B may perform functions including matching a pulse of the first laser beam W1 and a pulse of the second laser beam W2 in time and space. The incidence angle adjusting unit 150 may perform functions including adjusting an angle at which the second laser beam W2 is irradiated into a substrate 191 to be inspected. The substrate support unit 190 may perform a function of supporting the substrate 191. The detecting unit 160B may perform functions including detecting a defect of the substrate 191.

The substrate inspection apparatus 100C according to this embodiment may be configured to use an evanescent wave generated from the substrate 191 by coupling the first and second laser beams W1 and W2 in an FWM manner, to detect the defect of the substrate 191, similar to the previous embodiments. Since an RF frequency band signal in the substrate inspection apparatus 100C may be used, an optical filter (for example, an optical selection filter) may be omitted, and the detecting unit 160B capable of detecting at a relatively high speed may be provided.

Specifically, the light source unit 110B employed in this embodiment may include a laser light source 111, and an optical parametric amplifier 115. The laser light source 111 may emit a fundamental wave beam W0 having a predetermined frequency $\omega$. The optical parametric amplifier 115 may perform functions including wavelength-converting the fundamental wave beam W0 or wavelength-converting a portion of the fundamental wave beam W0 into a wavelength-converted beam W. The beam W converted by the optical parametric amplifier 115 may have a frequency $2\omega$ according to the converted wavelength. For example, the optical parametric amplifier 115 may include a non-linear crystal.

The light source unit 110B may include a first beam splitter 116a splitting the wavelength-converted beam W to provide first split laser beam W1' and second split laser beam W2' in different paths, and first optical modulator 119a and a second optical modulator 119b modulating the frequency $2\omega$ of the first split laser beam W1' and modulating the frequency $2\omega$ of the second split laser beam W2' to different frequencies. As a result, the light source unit 110B may output first laser beam W1 and second laser beam W2. For example, the first optical modulator 119a and second optical modulator 119b may include an acoustic optical modulator (AOM).

In this embodiment, the substrate inspection apparatus 100C may further include a second beam splitter 116b located between the optical parametric amplifier 115 and the first beam splitter 116a. The second beam splitter 116b may perform a function of splitting the wavelength-converted beam W in different first and second paths in the optical parametric amplifier 115.

On the first path, the wavelength-converted beam W may reach the first beam splitter 116a, and as described above, the beam W may be split through the first beam splitter 116a to provide first and second split laser beams W1' and W2' having the frequency $2\omega$ (i.e., the same frequency). In this case, the first and second split laser beams W1' and W2' may be provided as the first and second laser beams W1 and W2, modulated at first frequency ($2\omega+\delta 1$) and second frequency ($2\omega+\delta 2$) by the first optical modulator 119a and second optical modulator 119b, respectively.

The pulsed beam matching unit 120B employed in this embodiment may include an optical delay line having a plurality of mirrors 125a, 125b, 125c, and 125d. The optical delay line may provide a delay such that a pulse of the second split laser beam W2' and a pulse of the first split laser beam W1' overlap in time and space.

The incidence angle adjusting unit 150 employed in this embodiment may include a first objective lens 152 disposed on a front surface of the substrate 191 and configured to change a light-emitting angle of the first objective lens, depending on a light-receiving position on a light-receiving surface of the first objective lens, and a beam path adjusting unit 155 adjusting the first laser beam W1, matched by the pulsed beam matching unit 120B, to a position to be irradiated into the light-receiving surface. As described above, the substrate inspection apparatus 100C may be configured such that the second laser beam W2 is fixed to be irradiated in a direction, perpendicular to the surface of the substrate 191 (an incidence angle of 0°), while only an incidence angle of the first laser beam W1 is set (or adjusted) to have a range satisfying high-efficiency conditions. In addition, the substrate inspection apparatus 100C may further include first polarizer 118a and second polarizer 118b respectively disposed in paths of the first laser beam W1 and the second laser beam W2. In this embodiment, the first polarizer 118a and second polarizer 118b may be disposed on a front end of the first objective lens 152.

The matched first and second laser beams W1 and W2 may be irradiated onto the substrate 191 through the first objective lens 152 at a predetermined angle, to generate other non-linear beams (e.g., SFG, SHG, THG, or the like) together with an evanescent wave in a four-wave mixing (FWM) manner. When the first optical modulator 119a and second optical modulator 119b are provided as AOM, it can be seen that a frequency of the evanescent wave generated by the FWM manner is $2W+2\delta1-\delta2$. In addition, in this embodiment, when the substrate 191 may be a transparent substrate such as glass, the scattered light SL may be measured by the detecting unit 160B disposed on a rear surface of the substrate 191.

On the second path, a reference beam W' having the frequency $2\omega$ which is the same as the frequency $2\omega$ of the wavelength-converted beam W2 from the second beam splitter 116b may proceed to the detecting unit 160B. The detecting unit 160B employed in this embodiment may include a second objective lens 162B for collecting beams (e.g., SFG, SHG, THG, or the like) including scattered light SL by the FWM manner, a third beam splitter 163 receiving the above beams and the reference beam W', a balanced photodiode 167 selectively detecting only a signal based on the scattered light SL, and a scattered light detector 169 measuring intensity of the signal based on the scattered light SL transmitted from the balanced photodiode 167.

In general, the balanced photodiode 167 may include two (2) photodiodes having differential amplifiers, may be designed to compare a difference between two (2) correlated optical signals, and may be used to effectively remove noise in spectroscopic analysis. In this embodiment, the balanced photodiode 167 may use the reference beam W' to detect only a signal "$2\delta1-\delta2$" modulated through the scattered light SL by the FWM manner in beams received from the substrate 191. The detected "$2\delta1-\delta2$" signal may be amplified using a lock-in amplifier 168, and the scattered light detector 169 may receive the amplified signal to measure detected information (including presence or not, size, and location) relating to the defect.

In this method, since a background signal is zero (0), only a signal related to the scattered light SL due to the defect may be detected, and as a result, a signal-to-noise ratio (SNR) may be improved. In addition, since the substrate inspection apparatus 100C according to this embodiment may selectively detect a scattered light-related signal in the RF frequency domain, without a separate optical filter in the detecting unit, the information relating to the defect may be measured at a relatively high speed.

When the substrate 191 is a transparent substrate, since beams including scattered light SL may be detected on the rear surface of the substrate 191, the detecting unit 160 may be disposed on the rear surface of the substrate as in this embodiment. In the substrate inspection apparatus 100, the substrate inspection apparatus 100A, and the substrate inspection apparatus 100B according to the previous embodiments, when the substrate 191 to be inspected is a transparent substrate, the detecting unit 160 and the detecting unit 160A may be disposed on the rear surface of the substrate 191.

Alternatively, in the substrate inspection apparatus 100C according to this embodiment, when the substrate 191 is not a transparent substrate, an objective lens and the detecting unit 160B for concentrating light may be disposed on the front surface of the substrate, to detect beams scattered/reflected from the substrate 191, similarly to the previous embodiment.

Figure 9:
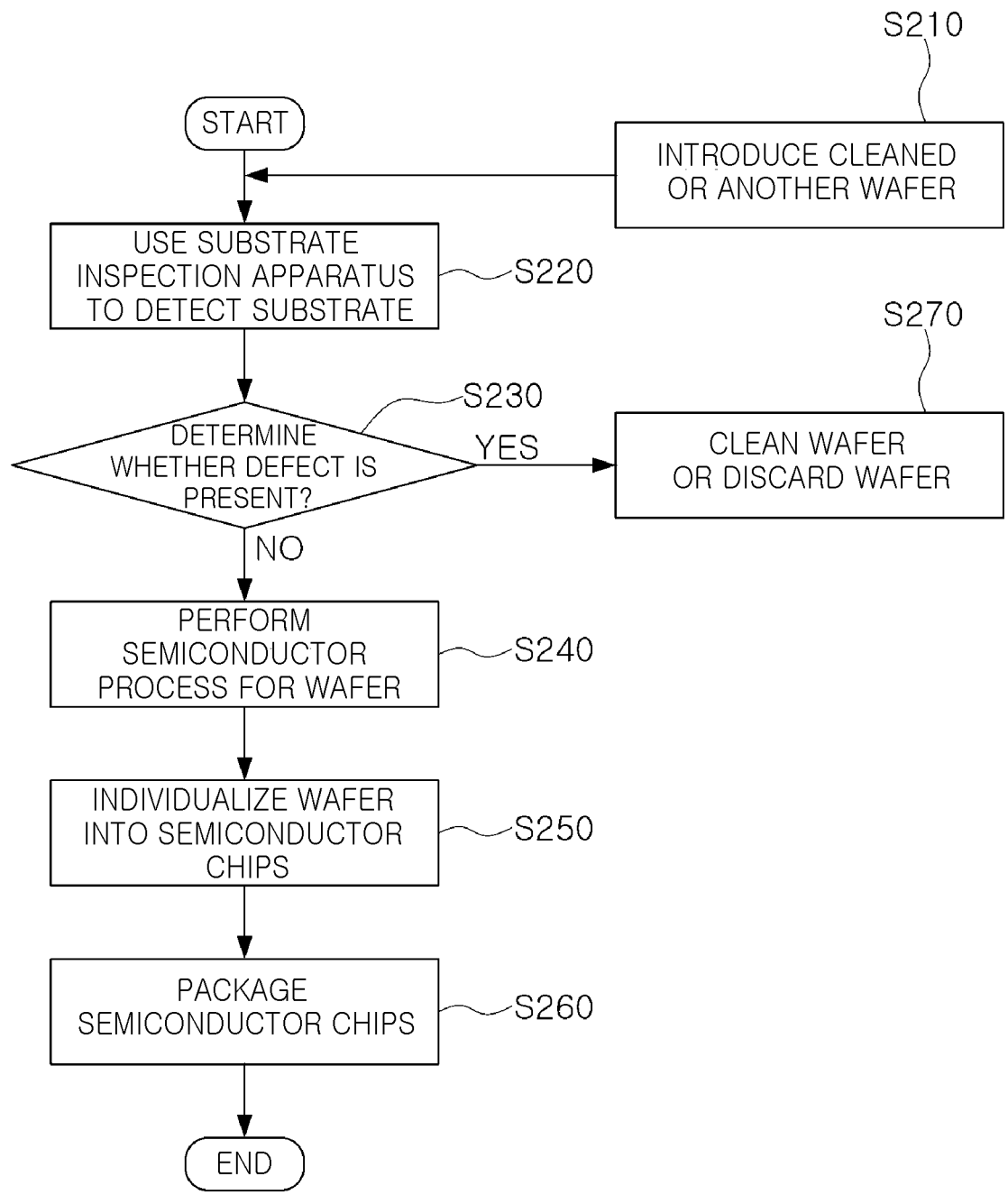
FIG. 9 is a flowchart illustrating a method of manufacturing a semiconductor device using a substrate inspection apparatus, according to an embodiment of the present disclosure.

FIG. 9 is a flowchart illustrating a method of manufacturing a semiconductor device using a substrate inspection apparatus, according to an embodiment of the present disclosure.

Referring to FIG. 9, a manufacturing method according to this embodiment may start from detecting a wafer (S220). The wafer to be inspected may be a wafer for manufacturing a semiconductor device or a wafer in which a structure (e.g., a pattern) for the semiconductor device is manufactured.

In an operation (S230), the manufacturing method may include determining whether a defect is present on the wafer. Different operations may be performed according to the determination result. First, when there is no defect in the wafer (No), a semiconductor process (S240) may be performed on the wafer. The semiconductor process. (S240) for the wafer may include various processes. For example, the semiconductor process for the wafer may include a deposition process, an etching process, an ion process, a cleansing process, and the like. The semiconductor process (S240) for the wafer may be performed to form integrated circuits and wirings required for the semiconductor device. The semiconductor process for the wafer may include a test process for the semiconductor device on a wafer level. During the semiconductor process (S240) for the wafer, the operation (S230) determining whether a defect is present on the wafer may be additionally performed for a periodic pattern formed on the wafer.

When semiconductor chips are completed in the wafer by the semiconductor process (S240) for the wafer, the wafer may be individualized into each of the semiconductor chips (S250). The individualization into each of the semiconductor chips (S250) may be achieved by a sawing process using a blade or a laser.

Subsequently, a packaging operation for the semiconductor chips may be performed (S260). The packaging operation (S260) may refer to an operation of mounting the semiconductor chips on a PCB and encapsulating the mounted semiconductor chips with an encapsulant material. The packaging operation may include stacking a plurality of semiconductors in multiple layers to form a stacked package on a PCB, or stacking a stacked package on the stacked package to form a package-on-package (POP) structure. The packaging operation for semiconductor chips may complete a semiconductor device or a semiconductor package. A test process for the semiconductor package may be performed after the packaging operation.

When there is a defect in the wafer (Yes) in the operation (S230) determining whether a defect is present on the wafer, the wafer may be cleaned or discarded (S270). Next, the cleaned wafer or another wafer may be introduced into the substrate inspection apparatus 100, the substrate inspection apparatus 100A, the substrate inspection apparatus 100B, and the substrate inspection apparatus 100C (S210), and an operation (S220) of detecting the wafer may be performed.

According to this embodiment, two laser beams may be coupled in a four-wave mixing (FWM) method to generate an evanescent wave on a substrate to be inspected. When a defect is present, the generated evanescent wave may generate scattered light due to the defect, and the scattered light may be used to detect the defect. In this case, since a background signal is zero (0), only a signal of the scattered light due to the defect may be detected, and as a result, a signal-to-noise ratio (SNR) may be improved. In addition, since two pulsed laser beams may be coupled to generate a wave (e.g., an evanescent wave) of a relatively short wavelength (e.g., deep ultraviolet (DUV)), a defect of a fine size (e.g., about 10 nm or less) may be detected.

Various and beneficial advantages and effects of the inventive concept(s) described herein are not limited to the above, and will be more easily understood in the course of describing specific embodiments of the present disclosure.

While example embodiments have been illustrated and described above, it will be apparent to those skilled in the art that modifications and variations could be made without departing from the scope of the inventive concept(s) described herein as defined by the appended claims.

What may be claimed is:

1. A method of manufacturing a semiconductor device, comprising:
    providing a substrate to be inspected;
    outputting a first laser beam having a first wavelength and a second laser beam having a second wavelength;
    matching the first laser beam and the second laser beam to superimpose a pulse of the first laser beam on a pulse of the second laser beam in time and space;
    adjusting angles of incidence of the matched first laser beam and second laser beam to irradiate the first laser beam and the second laser beam on the substrate;
    mixing the first laser beam and the second laser beam to generate an evanescent wave on the substrate, wherein the evanescent wave generates scattered light due to a defect of the substrate; and
    detecting the scattered light generated due to the defect of the substrate.

2. The method according to claim 1, wherein the outputting the first laser beam and the second laser beam comprises:
    generating the first laser beam; and
    converting a portion of the first laser beam to the second laser beam to output the first laser beam and the second laser beam.

3. The method according to claim 2, wherein the converting to a second laser beam is performed by using a non-linear crystal.

4. The method according to claim 1, wherein the outputting the first laser beam and the second laser beam comprises:
    generating the first laser beam and the second laser beam from a first laser light source and a second laser light source, respectively.

5. The method according to claim 1, wherein the matching the first laser beam and the second laser beam comprises:
    outputting the first laser beam and the second laser beam via different paths; and
    reducing a time delay between the pulse of the first laser beam and the pulse of the second laser beam.

6. The method according to claim 5, wherein reducing the time delay is performed by using a plurality of mirrors located on a path of the first laser beam.

7. The method according to claim 1, further comprising: monitoring a matching between a pulse of the first laser beam and a pulse of the second laser beam, based on intensity of mixed light of the first laser beam and the second laser beam on the substrate.

8. The method according to claim 7, wherein the monitoring the matching comprises:
    modulating a frequency of one laser beam of the first laser beam and the second laser beam;
    receiving the mixed light from the substrate to produce an optical signal related to the intensity of the mixed light; and
    amplifying the optical signal, in reference to the modulated frequency.

9. The method according to claim 8, wherein the modulating the frequency comprises using an optical chopper to periodically interfere with the one laser beam.

10. The method according to claim 1, wherein a wavelength of the evanescent wave is 800 nm or less.

11. The method according to claim 1, wherein the detecting the scattered light comprises:
    selecting the scattered light generated by the evanescent wave from light reflected from the substrate as selected scattered light; and
    measuring intensity of the selected scattered light.

12. The method according to claim 1, wherein the outputting the first laser beam and the second laser beam comprises:
    generating a beam having a fundamental wavelength;
    wavelength-converting a portion of the beam having the fundamental wavelength into a wavelength-converted beam;
    splitting the wavelength-converted beam into a split first beam and a split second beam;
    modulating a frequency of the split first beam to output the first laser beam having a first frequency; and
    modulating a frequency of the split second beam to output the second laser beam having a second frequency.

13. The method according to claim 12, wherein splitting the wavelength-converted beam into the split first beam and the split second beam, further comprises splitting the wavelength-converted beam into a split third beam.

14. The method according to claim 13, wherein the detecting the scattered light comprises:
    using the split third beam, to selectively detect only a signal based on the scattered light from light received from the substrate; and
    measuring intensity of the signal based on the detected scattered light.

15. The method according to claim 1, further comprising:
    emitting illumination light for monitoring to irradiate the illumination light in inspection region of the substrate; and
    using the illumination light reflected from the inspection region of the substrate, to monitor the inspection region of the substrate.

16. The method according to claim 1, wherein the first laser beam and the second laser beam are irradiated by using an objective lens configured to change a light-emitting angle of the objective lens, depending on a light-receiving position on a light-receiving surface of the objective lens, on the substrate.

17. A method of manufacturing a semiconductor device, comprising:
    providing a substrate to be inspected; and
    determining whether a defect of the substrate is present, wherein the determining comprises:
    generating a first laser beam having a first wavelength;
    receiving the first laser beam to convert a portion of the first laser beam to a second laser beam having a second wavelength, different from the first wavelength;
    outputting remaining portions of the first laser beam and the second laser beam via different paths;
    superimposing a pulse of the first laser beam on a pulse of the second laser beam by reducing a delay time the pulse;

adjusting angles of incidence of the first laser beam and the second laser beam to irradiate the first laser beam and the second laser beam on the substrate;

mixing the first laser beam and the second laser beam in a four-wave mixing (FWM) manner to generate an evanescent wave on the substrate, wherein the evanescent wave generates scattered light due to the defect of the substrate; and detecting the scattered light generated due to the defect of the substrate.

18. The method according to claim 17, wherein the first wavelength is 200 nm to 2000 nm, the second wavelength is 200 nm to 2000 nm, and a wavelength of the evanescent wave is 200 nm to 2000 nm.

19. The method according to claim 17, further comprising:

using an optical chopper in a path of one laser beam of the first laser beam and the second laser beam, to modulate a frequency of the one laser beam;

receiving mixed light of the first laser beam and the second laser beam, reflected from the substrate, to produce an optical signal related to intensity of the mixed light; and amplifying the produced signal, in reference to an operating frequency of the optical chopper.

20. A method of manufacturing a semiconductor device, comprising:

providing a substrate to be inspected; and determining whether a defect of the substrate is present, wherein the determining comprises:

generating a beam having a fundamental wavelength;

wavelength-converting the beam having the fundamental wavelength into a wavelength-converted beam;

splitting the wavelength-converted beam into a split first beam, a split second beam, and a split third beam;

modulating a frequency of the split first beam to output a first laser beam having a first frequency;

modulating a frequency of the split second beam to output a second laser beam having a second frequency;

matching the first laser beam and the second laser beam to superimpose a pulse of the first laser beam on a pulse of the second laser beam in time and space;

adjusting angles of incidence of the matched first laser beam and second laser beam to irradiate the first laser beam and the second laser beam on the substrate;

mixing the first laser beam and the second laser beam in a four-wave mixing (FWM) manner to generate an evanescent wave on the substrate, wherein the evanescent wave generates scattered light due to the defect of the substrate;

using the split third beam as a reference beam, to selectively detect only a signal based on the scattered light from light received from the substrate as detected scattered light; and measuring intensity of the signal based on the detected scattered light.

* * * * *